United States Patent
Saita et al.

(10) Patent No.: US 8,315,038 B2
(45) Date of Patent: Nov. 20, 2012

(54) THIN-FILM CAPACITOR AND ELECTRONIC CIRCUIT BOARD

(75) Inventors: Hitoshi Saita, Tokyo (JP); Naoto Tsukamoto, Tokyo (JP); Akira Shibue, Tokyo (JP); Kenji Horino, Tokyo (JP)

(73) Assignee: TDK Corporation, Tokyo (JP)

( * ) Notice: Subject to any disclaimer, the term of this patent is extended or adjusted under 35 U.S.C. 154(b) by 266 days.

(21) Appl. No.: 12/756,520

(22) Filed: Apr. 8, 2010

(65) Prior Publication Data
US 2010/0265632 A1    Oct. 21, 2010

(30) Foreign Application Priority Data

Apr. 15, 2009  (JP) .............................. P2009-098931
Mar. 17, 2010  (JP) .............................. P2010-061175

(51) Int. Cl.
*H01G 9/02* (2006.01)
*C04B 35/00* (2006.01)

(52) U.S. Cl. .................... 361/321.5; 501/136

(58) Field of Classification Search .... 361/321.1–321.5, 361/311; 501/134–136, 137–139
See application file for complete search history.

(56) References Cited

U.S. PATENT DOCUMENTS 7,026,680 B2    4/2006  Baniecki et al.
7,911,764 B2 *  3/2011  Sasabayashi et al. ...... 361/321.4
2007/0126041 A1 * 6/2007  Shinoda et al. ............... 257/295
2008/0010798 A1  1/2008  Borland et al.

FOREIGN PATENT DOCUMENTS

| JP | A-2000-91531 | 3/2000 |
| JP | A-2001-189422 | 7/2001 |
| JP | A-2004-281446 | 10/2004 |
| JP | A-2008-109082 | 5/2008 |
| WO | WO 2009037922 A1 * | 3/2009 |

* cited by examiner

*Primary Examiner* — Eric Thomas
(74) *Attorney, Agent, or Firm* — Oliff & Berridge, PLC

(57) ABSTRACT

A thin-film capacitor has a high insulation resistance value with high reliability. The thin-film capacitor includes a dielectric thin film and electrodes opposing each other through the dielectric thin film, the dielectric thin film containing a perovskite-type composite oxide having a composition expressed by (1), Mn, and at least one kind of element M selected from V, Nb, and Ta; wherein the dielectric thin film has an Mn content of 0.05 to 0.45 mol with respect to 100 mol of the composite oxide; and wherein the dielectric thin film has a total element M content of 0.05 to 0.5 mol with respect to 100 mol of the composite oxide:

$$A_yBO_3 \quad (1)$$

where A is at least one kind of element selected from Ba, Sr, Ca, and Pb, B is at least one kind of element selected from Ti, Zr, Hf, and Sn, and $0.97 \leq y \leq 0.995$.

3 Claims, 4 Drawing Sheets

(a)

(b)

THIN-FILM CAPACITOR AND ELECTRONIC CIRCUIT BOARD

BACKGROUND OF THE INVENTION

1. Field of the Invention

The present invention relates to a thin-film capacitor and an electronic circuit board.

2. Related Background Art

As electronic devices have been attaining a greater number of functions, electronic circuit boards included in the electronic devices have been desired to have various functions added thereto. Therefore, the electronic circuit boards tend to increase the number of electronic components mounted thereon. Such electronic circuit boards have strongly been desired to improve the area for mounting electronic components. As an answer to such demands, it has been proposed to embed electronic components within the electronic circuit boards. One of electronic components widely used in the electronic circuit boards is a multilayer ceramic capacitor which has conventionally been known. Embedding the conventional multilayer ceramic capacitor into a board, however, has been problematic in that the brittleness resulting from the thickness of the capacitor and the property of being ceramics may generate a stress in the process of embedding, thereby causing cracks in the capacitor, deforming the substrate in the embedded part, and so forth. These problems have been hard to overcome even when a very small multilayer ceramic capacitor is used. Therefore, as a capacitor to be embedded into the board, a low-profile capacitor which is thinner than the multilayer ceramic capacitor has been desired. Conventionally known as a low-profile capacitor is a thin-film capacitor (see Japanese Patent Application Laid-Open Nos. 2000-91531, 2001-189422, and 2008-109082).

SUMMARY OF THE INVENTION

The thickness of the conventional thin-film capacitor depends on the thickness of a substrate (e.g., an Si substrate) therein. Though various techniques for thinning Si and glass substrates have conventionally been known, they have been problematic in that properties of materials such as the hardness of the substrates may cause cracks or deformations such as those warping unidirectionally in the capacitor upon thinning. For overcoming such problems, a base whose initial thickness can easily be changed by polishing and the like, such as an Ni metal foil, is used in place of the substrate mentioned above. Making a dielectric thin film on a base such as a metal foil can arbitrarily change the total thickness of the thin-film capacitor, thereby thinning the thin-film capacitor. Thinning the dielectric thin film can mitigate the influence of the brittleness of ceramics and reduce the thickness of the thin-film capacitor. For making a dielectric body thinner, a dielectric film is not formed by the thick-film method used for the conventional multilayer ceramic capacitors, but by a thin-film method. This can form a capacitor having sufficiently large capacity and insulation resistance value even when the thickness of the dielectric film is small.

The thin-film capacitor thinned by the method mentioned above is also required to have an insulation resistance value equivalent to that of the conventional multilayer ceramic capacitor and reliability as a capacitor. The "reliability" as the capacitor refers to a characteristic that the insulation resistance value is hard to drop when a voltage is continuously applied to the thin-film capacitor in a high-temperature environment or a high-temperature, high-humidity environment. However, as the thin-film capacitor is made thinner, the field intensity becomes higher, and the insulation resistance value and the reliability as the capacitor are easier to decrease, thus leaving a problem.

In view of the above-mentioned problems, it is an object of the present invention to provide a thin-film capacitor having an insulation resistance value higher than that conventionally available and high reliability, and an electronic circuit board equipped with the thin-film capacitor.

For achieving the above-mentioned object, the thin-film capacitor in accordance with the present invention comprises a dielectric thin film and electrodes opposing each other through the dielectric thin film interposed therebetween; wherein the dielectric thin film contains a perovskite-type composite oxide having a composition expressed by the following chemical formula (1), Mn, and at least one kind of element M selected from the group consisting of V, Nb, and Ta; wherein the dielectric thin film has an Mn content of 0.05 to 0.45 mol with respect to 100 mol of the composite oxide; and wherein the dielectric thin film has a total element M content of 0.05 to 0.5 mol with respect to 100 mol of the composite oxide.

$$A_yBO_3 \quad (1)$$

In the chemical formula (1), A is at least one kind of element selected from the group consisting of Ba, Sr, Ca, and Pb, B is at least one kind of element selected from the group consisting of Ti, Zr, Hf, and Sn, and $0.97 \leq y \leq 0.995$.

The present invention can increase the insulation resistance value and improve the reliability as compared with the conventional thin-film capacitors.

Preferably, in the present invention, the dielectric thin film has a rare-earth element content of 0.0 to 0.3 mol with respect to 100 mol of the composite oxide. This can maintain the high insulation resistance value and high capacity value, while making it easier to improve the reliability.

Preferably at least a part of the dielectric thin film, more preferably the whole dielectric thin film, has a columnar structure in the present invention. That is, it will be preferred if the dielectric thin film is constituted by a plurality of columnar crystals extending normal to an electrode surface. As compared with a dielectric thin film having a granular structure, the dielectric thin film having a columnar structure enhances its relative permittivity, increases the capacity of the thin-film capacitor, and remarkably improves the insulation resistance value of the dielectric thin film and the reliability as the capacitor.

The electronic circuit board in accordance with the present invention comprises the thin-film capacitor in accordance with the present invention. As compared with the conventional thin-film capacitors, the thin-film capacitor in accordance with the present invention can attain a lower profile without lowering the insulation resistance value or deteriorating the reliability. The electronic circuit board in accordance with the present invention equipped with the thin-film capacitor having lowered its profile can freely optimize each of arrangements of the thin-film capacitor within the board, metal leads within the board, and electronic components mounted on its surface according to the purpose of the board. The electronic circuit board of the present invention embeds the capacitor therewithin, so as to increase the surface area for mounting other electronic components and the like, thereby improving the functionality as the electronic circuit board.

The present invention can provide a thin-film capacitor having an insulation resistance value higher than that conventionally available and high reliability, and an electronic circuit board equipped with the thin-film capacitor.

BRIEF DESCRIPTION OF THE DRAWINGS

FIG. 3(a) is a schematic sectional view of the electronic circuit board in accordance with an embodiment of the present invention, while FIG. 3(b) is a partly enlarged view of the electronic circuit board illustrated in FIG. 3(a).

DESCRIPTION OF THE PREFERRED EMBODIMENTS

Figure 1:
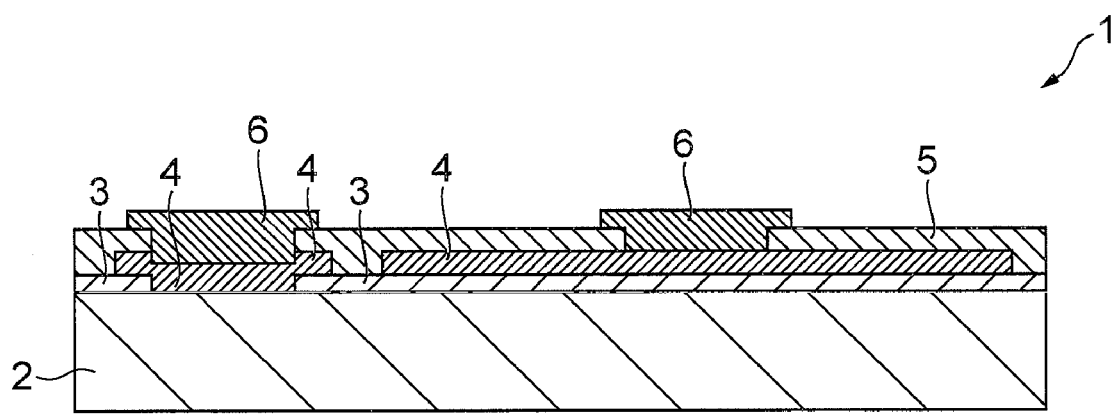
FIG. 1 is a schematic sectional view of the thin-film capacitor in accordance with an embodiment of the present invention.

In the following, preferred embodiments of the present invention will be explained in detail. However, the present invention is not limited to the following embodiments. The same or equivalent constituents will be referred to with the same signs. While positional relationships of the top, bottom, left, and right are as depicted in the drawings, ratios of dimensions are not limited to those in the drawings. Overlapping explanations, if any, will be omitted.

Thin-Film Capacitor

As illustrated in FIG. 1, a thin-film capacitor 1 in accordance with an embodiment comprises a base electrode 2, a dielectric thin film 3 disposed on a surface of the base electrode 2, an upper electrode 4 disposed on the upper face of the dielectric thin film 3, and at least one other upper electrode 4 directly disposed on the surface of the base electrode 2 by penetrating through the dielectric thin film 3. That is, the dielectric thin film 3 is held between at least one pair of base and upper electrodes 2, 4 opposing each other. An insulating resin layer 5 is disposed on the upper faces of the upper electrodes 4. A part of the upper face of each upper electrode 4 is provided with a lead electrode 6 penetrating through the insulating resin layer 5.

The dielectric thin film 3 contains a perovskite-type composite oxide having a composition expressed by the following chemical formula (1). The dielectric thin film 3 further contains at least one kind of element M selected from the group consisting of V, Nb, and Ta, and Mn.

$$A_y BO_3 \quad (1)$$

In the chemical formula (1), A is at least one kind of element selected from the group consisting of Ba, Sr, Ca, and Pb, B is at least one kind of element selected from the group consisting of Ti, Zr, Hf, and Sn, and $0.97 \leq y \leq 0.995$.

When y is less than 0.97, the insulation resistance value of the dielectric thin film 3 and the reliability as the capacitor become lower than those in the case where $0.97 \leq y \leq 0.995$. When y exceeds 0.995, the reliability as the capacitor becomes lower than that in the case where $0.97 \leq y \leq 0.995$. This embodiment can prevent these defects from occurring, since $0.97 \leq y \leq 0.995$.

The dielectric thin film 3 has an Mn content of 0.05 to 0.45 mol with respect to 100 mol of the composite oxide. When the Mn content is less than 0.05 mol, the insulation resistance value of the dielectric thin film 3 and the reliability as the capacitor become lower than those in the case where the Mn content is 0.05 to 0.45 mol. When the Mn content exceeds 0.45 mol, the reliability as the capacitor in a high-temperature, high-humidity environment becomes lower than that in the case where the Mn content is 0.05 to 0.45 mol. This embodiment can prevent these defects from occurring, since the Mn content is 0.05 to 0.45 mol.

The dielectric thin film 3 has a total element M content of 0.05 to 0.5 mol with respect to 100 mol of the composite oxide. When the total element M content is less than 0.05 mol, the reliability as the capacitor decreases. When the total element M content exceeds 0.5 mol, the reliability as the capacitor in a high-temperature, high-humidity environment decreases in particular. This embodiment can prevent these defects from occurring, since the total element M content is 0.05 to 0.5 mol.

Though the dielectric thin film 3 may contain at least one kind of rare-earth element selected from the group consisting of La, Ce, Pr, Nd, Pm, Sm, Eu, Gd, Tb, Dy, Ho, Er, Tm, Yb, Lu, Sc, and Y, it will be more preferred if their content is smaller. Specifically, it will be preferred if the total content of rare-earth elements in the dielectric thin film 3 is 0.0 to 0.3 mol with respect to 100 mol of the composite oxide, and more preferred if the dielectric thin film 3 contains no rare-earth element. When the total rare-earth element content is greater than 0.3 mol, the insulation resistance value, the reliability as the capacitor in the high-temperature, high-humidity environment, and the capacity of the thin-film capacitor tend to become lower than in the case where the total rare-earth element content is 0.0 to 03 mol. These tendencies can be suppressed when the total rare-earth element content is 0.0 to 03 mol. In the making of the thin-film capacitor 1, which will be explained later, rare-earth elements contained as impurities in the base electrode 2 or upper electrodes 4 may thermally diffuse from the base electrode 2 or upper electrodes 4 into the dielectric thin film 3, whereby the dielectric thin film 3 may contain rare-earth elements. The rare-earth element content in the dielectric thin film 3 may be adjusted by the purity of the base electrode 2 or upper electrodes 4 for use, for example.

The thickness of the dielectric thin film 3, which may be set appropriately according to the purpose of the thin-film capacitor, is about 10 to 1000 nm, for example. When the thickness of the dielectric thin film 3 is 1000 nm or greater, the brittleness of ceramics may become so remarkable that there is a possibility of cracks and the like occurring in the dielectric thin film at the time of making a thin film or during the embedding process. For improving the capacity value as the capacitor per mounting area, the inventors consider it more preferable if the thickness of the dielectric thin film 3 is 50 to 600 nm.

The base electrode 2, which may be a base metal or noble metal, preferably contains Ni as a main ingredient. Ni is preferred in that it is easily processable by CMP (Chemical Mechanical Processing) or the like and less expensive than noble metals. It will be more preferred if the purity of Ni constituting the base electrode 2 is higher; the purity is preferably 99.99% by weight or higher.

The base electrode 2 is preferably a metal foil, but may also be a metal thin film formed on a substrate made of Si, glass, ceramics, or the like. As with the metal foil, when forming a metal thin film on a substrate made of Si, glass, ceramics, or the like, it becomes necessary for the substrate to be thinned before or after the forming depending on the purpose. When the base electrode 2 is a metal foil, the thickness of the base electrode 2 is preferably 5 to 100 μm, more preferably 20 to 70 μm. When too thin, the base electrode 2 tends to be hard to handle at the time of manufacturing the thin-film capacitor 1. When the base electrode 2 is a metal thin film formed on a substrate, it will be preferred if the thickness of the base electrode 2 is 50 nm or greater while the thickness of the substrate is 5 to 100 μm. Forming the capacitor by thinning a substrate made of Si, glass, ceramics, or the like before or after forming a metal thin film, however, may cause cracks or deformations such as those warping unidirectionally in the capacitor as mentioned above. Before forming a metal thin film on a substrate, an adhesive layer may be formed on the substrate in order to improve the adhesion between the substrate and metal thin film.

The upper electrodes 4 may be made of a base metal or noble metal. In particular, the upper electrodes 4 are preferably made of pure metallic Ni, an alloy or compound containing at least Ni, pure metallic Cu, or an alloy or compound containing at least Cu. The upper electrodes 4 may also be made of an alloy or compound formed between Cu or Ni and a noble metal and an alloy or compound formed between Ni and Cu. The lead electrodes 6 may be made of a base metal or noble metal or an alloy or compound thereof as with the upper electrodes 4.

The insulating resin layer 5 may be formed from an epoxy-based resin, Teflon-based resin, polyimide-based resin, or the like, for example.

Preferably, the height of the thin-film capacitor 1 (the thickness of the thin-film capacitor 1 in the direction of laminating the base electrode 2, dielectric thin film 3, and upper electrodes 4) is 200 μm or less. Since the dielectric thin film 3 has a higher insulation resistance value and better reliability as the capacitor than those conventionally available, this embodiment can make the thin-film capacitor thinner than the conventional one without losing these characteristics, whereby the height of the thin-film capacitor 1 can be reduced to 200 μm or less. Lowering the profile of the thin-film capacitor 1 as such can improve the mechanical strength of the thin-film capacitor 1 against bending stresses, embed the thin-film capacitor 1 into an electronic circuit board, and allow the electronic circuit board to attain a lower profile and higher integration. Since the height of the thin-film capacitor 1 can freely be adjusted by regulating the respective thicknesses of the dielectric thin film 3, base electrode 2, upper electrodes 4, lead electrodes 6, and insulating resin layer 5, a capacitor having a low mounting height can be made. Therefore, in this embodiment, the thin-film capacitor can have a height of 100 μm or less or about 70 to 50 μm. For achieving a capacitor having a lower mounting height, the thin-film capacitor may be formed like a sheet. In this case, adjusting the thickness of electrodes holding the dielectric body therebetween as in the above can yield a thin-film capacitor having a mounting height lower than 50 μm.

In this embodiment, y which is the ratio of the number of elements in A site to the number of elements in B site in the perovskite-type composite oxide $A_yBO_3$ satisfies $0.97 \leq y \leq 0.995$, so that the number of elements in B site is richer than that in the stoichiometric composition. In this embodiment, the contents of Mn and element M added to the dielectric thin film 3 fall within the ranges mentioned above. Since the composition of the dielectric thin film 3 has these characteristics, this embodiment can enhance the insulation resistance value and improve the reliability as the capacitor as compared with the conventional thin-film capacitors.

It has conventionally been tried to improve the reliability as the capacitor by adding rare-earth elements to dielectric layers of ceramic capacitors. On the other hand, this embodiment can improve the reliability as the capacitor without adding rare-earth elements to the dielectric thin film 3.

$SiO_2$ to become a sintering aid has conventionally been added to dielectric layers of ceramic capacitors in order to sinter the dielectric layer of the ceramic capacitor and increase the capacity of the capacitor. On the other hand, as will be explained later, this embodiment can reduce the thickness of the dielectric body by forming it by a thin-film manufacturing method (thin-film method) without using $SiO_2$, whereby the capacity of the capacitor per unit area can fully be increased. Contrary to the conventional belief, adding $SiO_2$ to the dielectric thin film 3 tends to decrease the capacity in this embodiment. Therefore, in this embodiment, the Si content in the dielectric thin film 3 is preferably less than 0.5 mol, more preferably 0.05 mol or less, with respect to 100 mol of the composite oxide, and most preferably the dielectric thin film 3 contains no Si.

It has conventionally been tried to increase the insulation resistance value by adding Cr as an element other than Mn to the dielectric thin film. When Cr is added to the dielectric thin film, however, the insulation resistance value is more likely to change in response to the amount of Cr added than in the case where Mn is added, whereby the insulation resistance value may drastically change when the amount of Cr added slightly fluctuates. When Cr is added to the dielectric thin film, for example, the insulation resistance value may remarkably decrease depending on manufacturing conditions. Hence, there are cases where the insulation resistance value is hard to manage to fall within tolerance upon production. On the other hand, this embodiment uses Mn without Cr and thus can stabilize the insulation resistance value upon production. In this embodiment, even when the material of the dielectric thin film 3 contains Cr as an impurity, it will be more preferred if the Cr content in the dielectric thin film is smaller; the Cr content is preferably 0.04 mol or less (at the detection limit of X-ray fluorometry or less) with respect to 100 mol of the composite oxide.

Method of Manufacturing Thin-Film Capacitor

Figure 2:
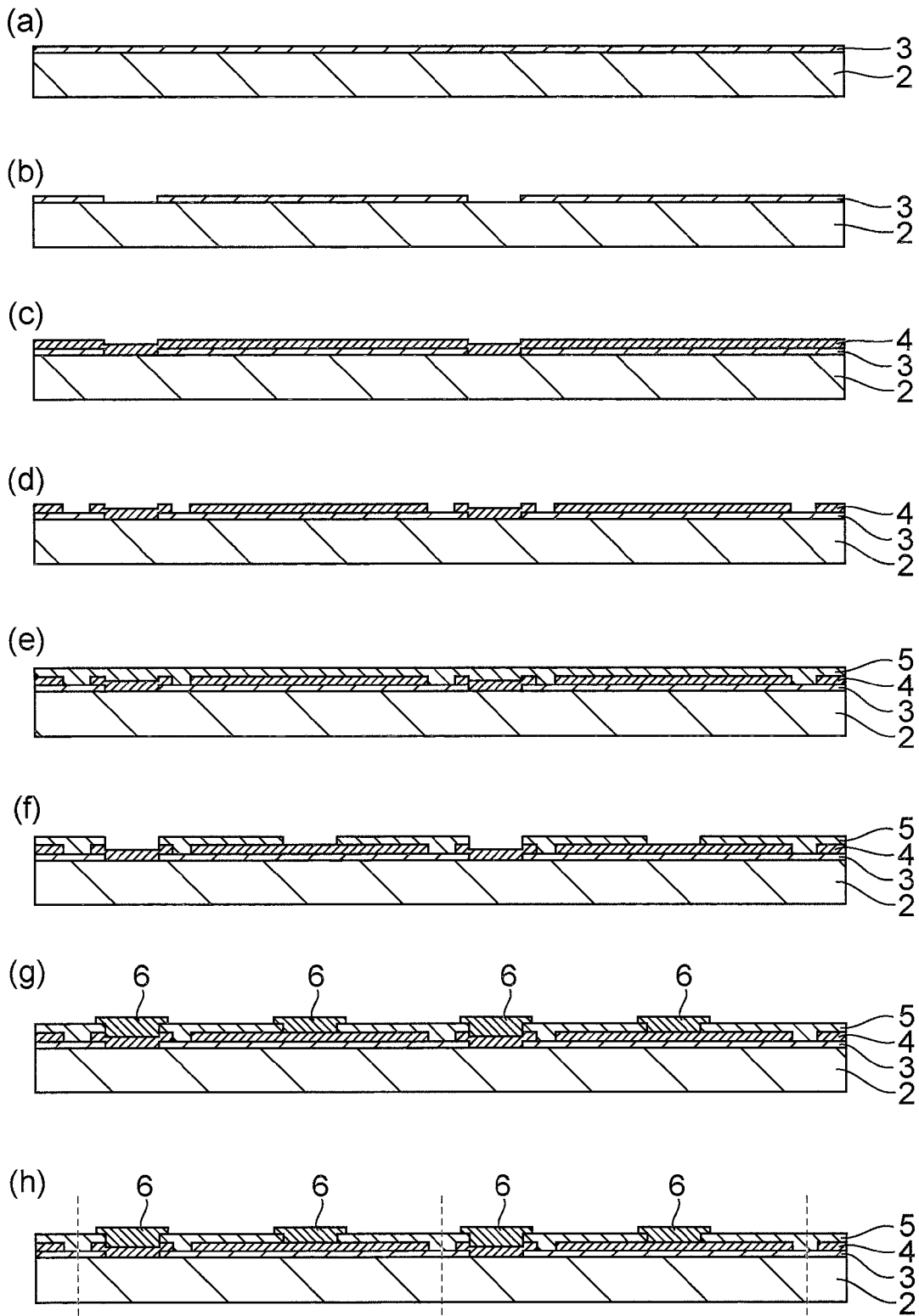
FIG. 2 is a schematic view illustrating individual steps of the method of manufacturing a thin-film capacitor in accordance with an embodiment of the present invention.

A method of manufacturing the thin-film capacitor 1 will now be explained with reference to FIG. 2.

First, as illustrated in FIG. 2(a), a dielectric thin film 3 is formed on a surface of a base electrode 2. Though an example of forming the dielectric thin film 3 by a chemical solution method will be explained in the following, other methods such as sputtering, CVD, vapor deposition, PLD, and MOCVD can also be used for forming the dielectric thin film 3. Using such a thin-film method can form a dielectric thin film thinner than the dielectric layer of the conventional ceramic capacitor. Using this thin-film method can also generate a columnar structure in a part or whole of the dielectric thin film. The dielectric thin film having a columnar structure has a high density and is constituted by highly ferroelectric columnar crystals. Therefore, using the above-mentioned thin-film method can manufacture a thin-film capacitor having a relatively large capacity in spite of its thinness. It is difficult for the conventional ceramic capacitor manufacturing methods to form a dielectric thin film having such a columnar structure.

The chemical solution method prepares a solution (hereinafter referred to as "metal solution") containing at least one kind of element as the above-mentioned element A selected from the group consisting of Ba, Sr, Ca, and Pb, at least one kind of element as the above-mentioned element B selected from the group consisting of Ti, Zr, Hf, and Sn, Mn, and at least one kind of element as the above-mentioned element M selected from the group consisting of V, Nb, and Ta.

The content of the element A in the metal solution is adjusted to 0.97 to 0.995 mol with respect to 1 mol of the element B. The content of Mn in the metal solution is adjusted to 0.05 to 0.45 mol with respect to 100 mol of the element B. The content of the element M in the metal solution is adjusted to 0.05 to 0.5 mol with respect to 100 mol of the element B.

A specific example of the metal solution is a solution obtained by dissolving respective organic acid salts of the elements A and B, Mn, and the element M into an organic solvent such as alcohol or the like. Examples of the organic acid salts include octylates, neodecanates, stearates, and naphthenates.

The chemical solution method applies the metal solution onto the surface of the base electrode 2 flattened by CMP or the like, so as to form a coating. The coating is pyrolyzed in the air at about 400 to 600° C., so as to thermally decompose organic matters in the coating. The pyrolyzed coating is sintered in a vacuum atmosphere at 500 to 1000° C., so as to yield the dielectric thin film 3 containing the crystallized composite oxide $A_yBO_3$. A cycle consisting of forming a coating, pyrolysis, and sintering may be repeated, so as to form the dielectric thin film 3 having a desirable thickness. The thickness of the dielectric thin film 3 can be adjusted by the content of each organic salt in the metal solution, the thickness of the coating, and the number of repetitions of the above-mentioned cycle. The surface of the base electrode 2 may also be flattened by a method such as electropolishing or buffing instead of CMP.

Examples of methods for applying the metal solution include those using spin coaters, die coaters, slit coaters, printing, and spray coaters.

After being formed, the dielectric thin film 3 is patterned as illustrated in FIG. 2(b). The patterning may be carried out by wet etching with a solution of nitric acid and hydrogen peroxide or the like, for example. After patterning the dielectric thin film 3, an upper electrode layer 4 is foamed on surfaces of the dielectric thin film 3 and base electrode 2 as illustrated in FIG. 2(c). The upper electrode layer 4 may be formed by sputtering. The upper electrode layer 4 is patterned as illustrated in FIG. 2(d), so as to form upper electrodes 4. The upper electrode layer 4 may be patterned by wet etching with an aqueous ammonium persulfate solution, for example. After forming the upper electrodes 4, an insulating resin layer 5 is formed as illustrated in FIG. 2(e), and then through holes are formed in the insulating resin layer 5 as illustrated in FIG. 2(f). After forming the through holes, lead electrodes 6 are formed as illustrated in FIG. 2(g). Then, a part corresponding to each capacitor is cut out by dicing as illustrated in FIG. 2(h), whereby the thin-film capacitor 1 illustrated in FIG. 1 can be obtained. The foregoing manufacturing method can yield a thin-film capacitor of 1005 size (1 mm×0.5 mm), for example.

Electronic Circuit Board

Figure 3:
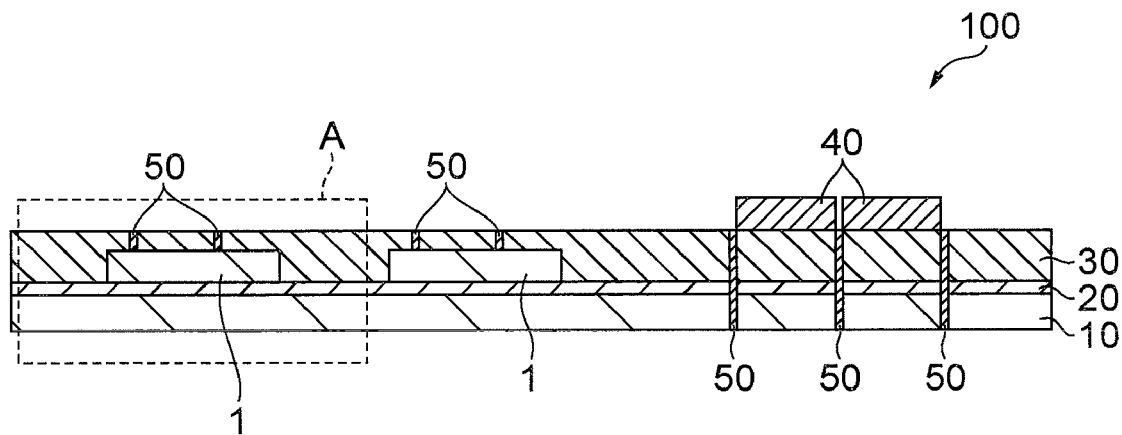
Figure 3:
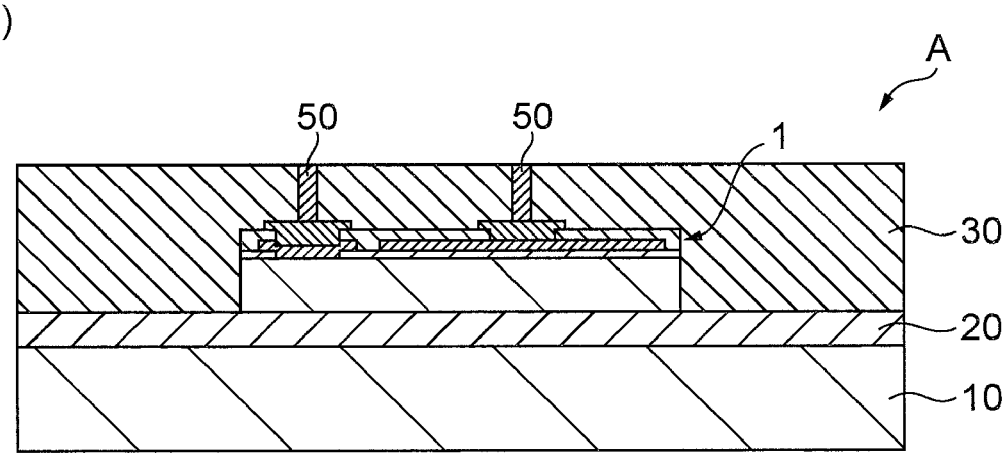

As illustrated in FIGS. 3(a) and 3(b), an electronic circuit board 100 in accordance with an embodiment comprises an epoxy-based resin substrate 10, a resin layer 20 formed on the epoxy-based resin substrate 10, thin-film capacitors 1 mounted on the resin layer 20, an insulating coating layer 30 formed on the resin layer 20 mounted with the thin-film capacitors 1, electronic components 40 placed on the insulating coating layer 30, and metal leads 50 made of Cu or the like drawn to the surface of the epoxy-based resin substrate 10 or insulating coating layer 30. A part of the metal leads 50 penetrates through the electronic circuit board 100 in order to establish conduction between the upper and lower faces of the electronic circuit board 100. In this embodiment, the thin-film capacitors 1 are embedded within the electronic circuit board 100.

When manufacturing the electronic circuit board 100, an uncured resin layer which is a precursor of the resin layer 20 is formed on the epoxy-based resin substrate 10 at first. Subsequently, the thin-film capacitors 1 are mounted on the uncured resin layer such that the base electrode 2 of each thin-film capacitor 1 and the uncured resin layer face each other. Then, the insulating coating layer 30 is formed on the uncured resin layer mounted with the thin-film capacitors 1, so that the thin-film capacitors 1 are held between the epoxy-based resin substrate 10 and the insulating coating layer 30. Thereafter, the uncured resin layer is thermally cured, so as to form the resin layer 20, while the epoxy-based resin substrate 10 and the insulating coating layer 30 are bonded together under pressure by thermal pressing. Next, through holes are formed, the metal leads 50 are formed within the through holes, and then the electronic components 40 are mounted on the insulating coating layer 30. This yields the electronic circuit board 100 within which the thin-film capacitors 1 are embedded. The uncured resin layer may be formed from a B-stage epoxy resin or the like which is uncured at room temperature but adapted to thermally cure upon heating. The insulating coating layer 30 may be formed from an epoxy-based resin, Teflon-based resin, polyimide-based resin, or the like, for example.

Though preferred embodiments of the thin-film capacitor and electronic circuit board in accordance with the present invention are explained in the foregoing, the present invention is not always limited thereto.

For example, the thin-film capacitor may be a multilayer thin-film capacitor comprising a plurality of inner electrodes laminated alternately with a plurality of dielectric thin films. Such a thin-film capacitor may be manufactured by forming a dielectric thin film on a base electrode, then alternately repeating the step of forming an inner electrode on the dielectric thin film and the step of forming a thin film on the inner electrode a plurality of times, and finally forming an upper electrode or dielectric thin film. This repetition yields a structure in which the inner electrodes and dielectric thin films are alternately laminated. Assuming that the base electrode is the first electrode in this multilayer structure, the inner electrode and upper electrode correspond to layers with odd and even ordinal numbers, respectively. Connecting the layers having odd ordinal numbers to each other with a metal lead, connecting the layers having even ordinal numbers to each other with a metal lead, and taking them out as terminals can complete a multilayer capacitor. The metal used for the inner electrodes may be of the same kind as that of the base or upper electrode and is preferably a compound or alloy containing at least Ni.

EXAMPLES

The present invention will now be explained in detail with reference to examples, which do not restrict the present invention.

Sample 1

As a base electrode, an Ni foil having its surface flattened by CMP was prepared. The thickness of the Ni foil after flattening the surface was 50 μm. The Ni foil had a size of 10 mm (L)×10 mm (W). As a metal solution employed in the chemical solution method for forming a dielectric thin film, a butanol solution having dissolved respective octylates of Ba, Ti, Mn, and V was prepared. The molar ratios of Ba, Ti, Mn, and V in the metal solution were adjusted such as to yield a desirable composition of the dielectric thin film which will be explained later.

The metal solution was applied to the whole surface of the Ni foil by a spin coater, so as to foils a coating. The coating was pyrolyzed in the air at 400° C., so as to thermally decompose organic matters in the coating. The pyrolyzed coating was then sintered in vacuum at 900° C. This cycle of forming the coating, pyrolysis, and sintering was repeated, so as to form a dielectric thin film having a thickness of 300 nm on the Ni foil.

The X-ray fluorometry (XRF) showed that the dielectric thin film had a composition listed in Table 1.

Next, a Cu electrode as an upper electrode was formed on the dielectric thin film by sputtering through a metal mask. The thickness of the Cu electrode was 1 µm. The Cu electrode had a circular form with a diameter of 2 mm. This yielded the thin-film capacitor of Sample 1. The thin-film capacitor had a substantial thickness of 51.3 µm. Here, respective thin-film capacitors for a high-temperature load test and a high-temperature, high-humidity load test which will be explained later were made separately.

Measurement of the Insulation Resistance Value Before the Load Tests

The insulation resistance value of the thin-film capacitor was measured before carrying out each of the high-temperature load test and high-temperature, high-humidity load test that will be explained later. The results are listed in Table 1. In the measurement, a voltage of DC 4 V was applied to the thin-film capacitor placed in a room-temperature environment.

High-Temperature Load Test

The high-temperature load test is a test in which a constant voltage load is continuously applied for a predetermined time to a thin-film capacitor held in a high-temperature environment, so as to evaluate the deterioration in the insulation resistance value of the thin-film capacitor. Specifically, the thin-film capacitor was held in an atmosphere at 85° C. for 1000 hr while a voltage of DC 4 V (an electric field of 13.3 V/µm) was applied to the dielectric thin film having a thickness of 300 nm in the thin-film capacitor. After the lapse of 1000 hr, the thin-film capacitor was placed in a room-temperature environment, a voltage of DC 4 V was applied to the thin-film capacitor, and the insulation resistance value after the high-temperature load test was measured. The result is listed in Table 1. As the amount of decrease in the insulation resistance value after the high-temperature load test is smaller, the reliability as the capacitor is higher.

High-Temperature, High-Humidity Load Test

The high-temperature, high-humidity load test is a test in which a constant voltage load is continuously applied for a predetermined time to a thin-film capacitor held in a high-temperature, high-humidity environment, so as to evaluate the deterioration in the insulation resistance value of the thin-film capacitor. Specifically, the thin-film capacitor was held in an atmosphere at 130° C., 85% RH for 100 hr while a voltage of DC 3.5 V (an electric field of 11.6 V/µm) was applied to the dielectric thin film having a thickness of 300 nm in the thin-film capacitor. After the lapse of 100 hr, the thin-film capacitor was placed in a room-temperature environment, a voltage of DC 4 V was applied to the thin-film capacitor, and the insulation resistance value after the high-temperature, high-humidity load test was measured. The result is listed in Table 1. As the amount of decrease in the insulation resistance value after the high-temperature, high-humidity load test is smaller, the reliability as the capacitor is higher.

Samples 2 to 42

Thin-film capacitors of Samples 2 to 42 were made as with Sample 1 except that dielectric thin films having the compositions listed in Tables 1 and 2 were formed. The insulation resistance values of Samples 2 to 42 were measured before and after the high-temperature load test and high-temperature, high-humidity load test as with Sample 1. The measurement results are listed in Tables 1 and 2. The XRF showed that the dielectric thin films in the thin-film capacitors of Samples 1 to 42 contained no rare-earth elements such as Ho (i.e., the rare-earth element content in the dielectric thin film was less than the detection limit).

Samples 26a and 26b

Thin-film capacitors of Samples 26a and 26b were made as with Sample 1 except that dielectric thin films having the compositions listed in Table 3 were formed by causing the metal solution to contain an octylate of Ho. The compositions of the dielectric thin films of Samples 26a, 26b were shown by the Me as with Sample 1. The insulation resistance values of Samples 26a and 26b were measured before and after the high-temperature load test and high-temperature, high-humidity load test as with Sample 1. Before the tests, an AC voltage of 1 kHz was applied to Samples 26, 26a, 26b in a room-temperature environment, so as to measure their respective capacities. In the capacity measurement, the effective value of AC voltage was 1 Vrms. The measurement results are listed in Table 3.

In the following Tables 1 to 3, each of the insulation resistance values before and after the high-temperature load test and high-temperature, high-humidity load test is preferably $(1.0E+07)\Omega$ or greater, more preferably $(1.0E+08)\Omega$ or greater. In Tables 1 to 3, "ZE+0N" (where Z is a given positive real number, and N is a given natural number) refers to "$Z \times 10^N$". In Tables 1 to 3, "short" refers to a state where the resistance value of the sample has a resistance value of about 1Ω (conductive state), i.e., a short-circuited state.

TABLE 1

| | | Dielectric thin film composition $Ba_yTiO_3 + (a/100) - Mn + (b/100) - V$ | | | Insulation resistance value | | |
|---|---|---|---|---|---|---|---|
| | Sample No. | Ba/Ti y [—] | Mn a [mol] | V b [mol] | Before tests | After high-temperature load test [Ω] (1/cm²) | After high-temperature high-humidity load test |
| Comparative Example | 1 | 1.01 | 0.2 | 0.2 | 6.8E+09 | short | short |
| Comparative Example | 2 | 1 | 0.2 | 0.3 | 1.8E+09 | short | short |
| Comparative Example | 3 | 0.995 | 0.1 | 0.6 | 1.6E+09 | 5.8E+07 | short |
| Example | 4 | 0.995 | 0.1 | 0.5 | 1.1E+09 | 1.6E+08 | 1.0E+08 |
| Example | 5 | 0.995 | 0.1 | 0.4 | 8.4E+08 | 3.0E+08 | 4.8E+08 |
| Example | 6 | 0.995 | 0.1 | 0.3 | 4.6E+08 | 1.8E+08 | 3.7E+08 |
| Example | 7 | 0.995 | 0.1 | 0.2 | 2.0E+08 | 1.4E+08 | 1.6E+08 |
| Example | 8 | 0.995 | 0.1 | 0.1 | 1.7E+08 | 2.6E+07 | 7.8E+07 |

TABLE 1-continued

| | | Dielectric thin film composition $Ba_yTiO_3 + (a/100) - Mn + (b/100) - V$ | | | Insulation resistance value | | |
|---|---|---|---|---|---|---|---|
| | | | | | Before tests | After high-temperature load test [Ω] (1/cm²) | After high-temperature high-humidity load test |
| | Sample No. | Ba/Ti y [—] | Mn a [mol] | V b [mol] | | | |
| Example | 9 | 0.995 | 0.1 | 0.05 | 1.6E+08 | 1.0E+07 | 6.0E+07 |
| Comparative Example | 10 | 0.995 | 0.1 | 0 | 1.3E+08 | short | 3.8E+00 |
| Comparative Example | 11 | 0.995 | 0 | 0.2 | 3.4E+07 | short | short |
| Comparative Example | 12 | 0.99 | 0.2 | 0.6 | 1.7E+09 | 1.3E+08 | short |
| Example | 13 | 0.99 | 0.2 | 0.5 | 1.7E+09 | 2.8E+08 | 2.4E+08 |
| Example | 14 | 0.99 | 0.2 | 0.4 | 4.8E+08 | 2.8E+08 | 2.8E+08 |
| Example | 15 | 0.99 | 0.2 | 0.3 | 5.9E+08 | 2.8E+08 | 2.8E+08 |
| Example | 16 | 0.99 | 0.2 | 0.2 | 3.5E+08 | 2.0E+08 | 1.8E+08 |
| Example | 17 | 0.99 | 0.2 | 0.1 | 2.1E+08 | 1.0E+08 | 1.1E+08 |
| Example | 18 | 0.99 | 0.2 | 0.05 | 1.3E+08 | 3.3E+07 | 5.2E+07 |
| Comparative Example | 19 | 0.99 | 0.1 | 0 | 5.5E+07 | short | 6.9E+06 |
| Comparative Example | 20 | 0.99 | 0 | 0.2 | 1.5E+07 | short | short |
| Comparative Example | 21 | 0.98 | 0.3 | 0.6 | 9.5E+08 | 1.0E+08 | short |

TABLE 2

| | | Dielectric thin film composition $Ba_yTiO_3 + (a/100) - Mn + (b/100) - V$ | | | Insulation resistance value | | |
|---|---|---|---|---|---|---|---|
| | | | | | Before tests | After high-temperature load test [Ω] (1/cm²) | After high-temperature high-humidity load test |
| | Sample No. | Ba/Ti y [—] | Mn a [mol] | V b [mol] | | | |
| Example | 22 | 0.98 | 0.3 | 0.5 | 2.0E+09 | 3.2E+08 | 3.1E+08 |
| Example | 23 | 0.98 | 0.3 | 0.4 | 1.3E+09 | 5.1E+08 | 5.5E+08 |
| Comparative Example | 24 | 0.98 | 0.6 | 0.3 | 1.8E+08 | 5.1E+08 | short |
| Example | 25 | 0.98 | 0.45 | 0.3 | 2.5E+08 | 1.3E+08 | 2.2E+08 |
| Example | 26 | 0.98 | 0.3 | 0.3 | 8.4E+08 | 4.3E+08 | 2.4E+08 |
| Example | 27 | 0.98 | 0.3 | 0.2 | 2.5E+08 | 1.6E+08 | 2.0E+08 |
| Example | 28 | 0.98 | 0.3 | 0.1 | 2.8E+08 | 2.1E+08 | 1.5E+08 |
| Example | 29 | 0.98 | 0.3 | 0.05 | 2.0E+08 | 1.0E+08 | 1.1E+08 |
| Comparative Example | 30 | 0.98 | 0.3 | 0 | 1.9E+08 | short | 2.7E+07 |
| Example | 31 | 0.98 | 0.05 | 0.3 | 4.6E+07 | 1.8E+07 | 3.9E+07 |
| Comparative Example | 32 | 0.98 | 0 | 0.4 | 5.6R+06 | short | short |
| Comparative Example | 33 | 0.97 | 0.3 | 0.6 | 4.0E+09 | 1.4E+08 | short |
| Example | 34 | 0.97 | 0.3 | 0.5 | 2.3E+09 | 2.8E+08 | 1.5E+08 |
| Example | 35 | 0.97 | 0.3 | 0.4 | 6.3E+08 | 2.4E+08 | 4.8E+08 |
| Example | 36 | 0.97 | 0.3 | 0.3 | 4.5E+08 | 2.7E+08 | 3.6E+08 |
| Example | 37 | 0.97 | 0.3 | 0.2 | 2.6E+08 | 2.0E+08 | 2.2E+08 |
| Example | 38 | 0.97 | 0.3 | 0.1 | 2.0E+08 | 1.8E+08 | 1.7E+08 |
| Example | 39 | 0.97 | 0.3 | 0.05 | 1.6E+08 | 1.1E+07 | 1.1E+08 |
| Comparative Example | 40 | 0.97 | 0.3 | 0 | 9.0E+07 | short | 3.2E+07 |
| Comparative Example | 41 | 0.97 | 0 | 0.4 | 1.1E+06 | short | short |
| Comparative Example | 42 | 0.96 | 0.3 | 0.2 | 2.9E+06 | 7.2E+05 | 2.1E+05 |

TABLE 3

| | Sample No. | Dielectric thin film composition $Ba_yTiO_3 + (a/100) - Mn + (b/100) - V + (c/100) - Ho$ | | | | Insulation resistance value | | Capacity [μF/cm²] |
| --- | --- | --- | --- | --- | --- | --- | --- | --- |
| | | Ba/Ti y [—] | Mn a [mol] | V b [mol] | Ho c [mol] | Before tests [Ω] | After high-temperature high-humidity load test (1/cm²) | |
| Example | 26 | 0.98 | 0.3 | 0.3 | 0 | 8.4E+08 | 2.4E+08 | 6.8 |
| Example | 26a | 0.98 | 0.3 | 0.3 | 0.3 | 1.9E+08 | 1.0E+08 | 6.5 |
| Comparative Example | 26b | 0.98 | 0.3 | 0.3 | 0.5 | 2.1E+07 | 9.8E+05 | 5.8 |

In Tables 1 to 3, it was seen that each of the insulation resistance values before and after the high-temperature load test and high-temperature, high-humidity load test was $(1.0E+07)\Omega$ or higher in samples (examples) whose dielectric thin films had compositions satisfying the following chemical formula (1a), $0.05 \leq a \leq 0.45$, and $0.05 \leq b \leq 0.5$:

$$Ba_yTiO_3 \quad (1a)$$

where $0.97 \leq y \leq 0.995$.

In Tables 1 to 3, on the other hand, it was seen that at least one of the insulation resistance values before and after the high-temperature load test and high-temperature, high-humidity load test was less than $(1.0E+07)\Omega$ in samples (comparative examples) whose dielectric thin films had compositions failing to satisfy at least one of conditions of the above-mentioned chemical formula (1a), $0.05 \leq a \leq 0.45$, and $0.05 \leq b \leq 0.5$. Also, the samples of comparative examples except for Sample 42 were seen to cause short circuits after the high-temperature load test or high-temperature, high-humidity load test.

In samples whose y is 1 or greater (samples in which the ratio A/B of the number of elements A in A site to the number of elements B in B site in the perovskite-type composite oxide $A_yBO_3$ is 1 or greater) in Tables 1 to 3, excess elements in A site are presumed to remain as $BaCO_3$ in the dielectric thin film without reacting in the sintering step. Such a carbonate has a water absorbability and acts to deteriorate the moisture resistance of the dielectric thin film. This seems to be the reason why the insulation resistance values after the tests decreased remarkably when y was 1 or greater. When any of a and b (the respective contents of Mn and V in the case where the content of the composite oxide was assumed to be 100 mol) was greater than 0.6, on the other hand, it seems that the crystallization and densification of the dielectric thin film failed to advance in the sintering step, so as to form a number of voids in the dielectric thin film, thereby deteriorating the moisture resistance of the dielectric thin film.

Analysis of the Crystal Structure

Figure 4:
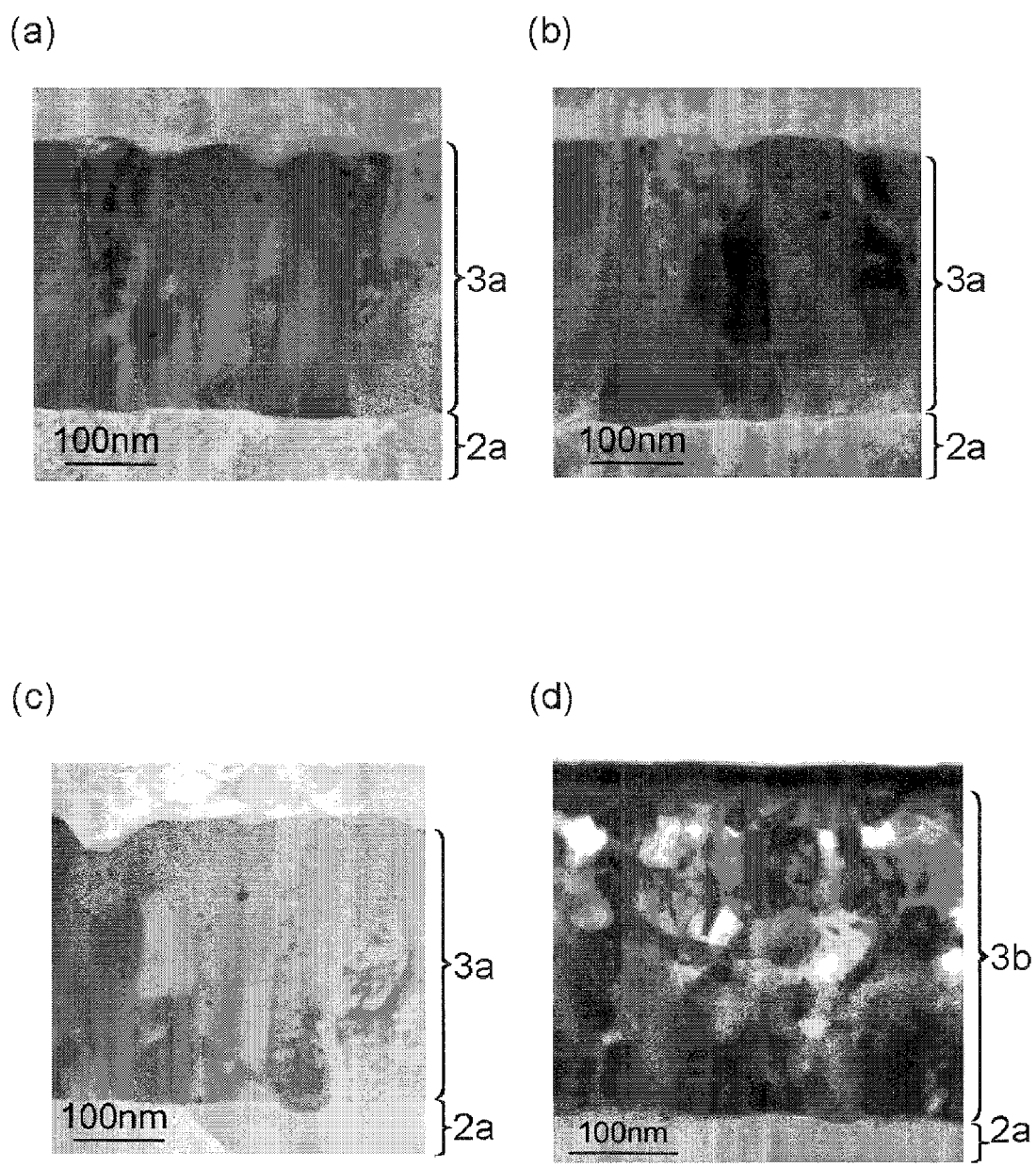
FIGS. 4(a), (b), (c), and (d) illustrate cross-sections of Samples 16, 27, 37, and 16a captured through a TEM, respectively.

Each of the thin-film capacitors of Samples 16, 27, and 37 was cut along the direction in which the Ni foil and Cu electrode opposed each other, and the resulting cross section was captured through a transmission electron microscope (TEM). FIG. 4(a) illustrates the cross section of Sample 16 captured through the TEM. FIG. 4(b) illustrates the cross section of Sample 27 captured through the TEM. FIG. 4(c) illustrates the cross section of Sample 37 captured through the TEM.

As illustrated in FIGS. 4(a), 4(b), and 4(c), a columnar structure was seen to exist in the dielectric thin film in each of Samples 16, 27, and 37. The samples of the other examples are expected to have columnar structures, since they were made by the same method using substantially the same materials as those of Samples 16, 27, and 37. As in the foregoing, it was seen that dense columnar structures could be obtained by the thin-film method. The dielectric thin films having such a dense columnar structure cannot be made by typical methods of manufacturing ceramic capacitors.

Sample 16a

The thin-film capacitor of Sample 16a was made as with Sample 16 except that the number of sintering operations was reduced to ⅓ when forming the dielectric thin film by repeating the cycle of forming the coating, pyrolysis, and sintering. FIG. 4(d) illustrates a cross section of Sample 16a captured as with Sample 16.

As can be seen when comparing the cross section of Sample 16 in FIG. 4(a) and the cross section of Sample 16a in FIG. 4(d) with each other, no columnar structure was seen in Sample 16a whose number of sintering operations was ⅓ that of Sample 16. The dielectric thin film of Sample 16a was found to have a granular structure as with typical ceramic capacitors. White portions of FIG. 4(d) are expected to be voids, so that the density of the dielectric thin film of Sample 16a is deemed to be lower than that of the dielectric thin film of Sample 16 having a columnar structure.

The respective capacities of the thin-film capacitors of Samples 16, 16a were measured as with Sample 26. The capacity of Sample 16 was 6.7 μF/cm². The capacity of Sample 16a was 3 μF/cm².

The capacity of Sample 16a whose dielectric thin film had a granular structure was seen to be reduced to half that of Sample 16 whose dielectric thin film had a columnar structure. One of its causes seems to lie in that the density of the dielectric thin film in Sample 16a was reduced by the increase in voids between granular particles. Another cause is presumed to lie in that the granular particles constituting the dielectric thin film of Sample 16a are spherical particles having small particle sizes and thus are inferior to columnar particles in terms of ferroelectricity. Even if the voids in the dielectric thin film having a granular structure are reduced, each of ceramic particles constituting the dielectric thin film is so small that its ferroelectricity will be lower than that of a columnar particle. Therefore, the capacity value of the thin-film capacitor having a granular structure without voids is also expected to be lower than that of the thin-film capacitor having a columnar structure. Hence, for improving the capacity value, it seems desirable to produce a columnar structure which is not owned by typical ceramic capacitors in a part or whole of the dielectric thin film.

Sample 43

As Sample 43, a thin-film capacitor having a discrete device form of 1005 size was made. The manufacturing method explained in the above-mentioned embodiment was used for making Sample 43. The structure of Sample 43 was the same as that illustrated in FIG. 1. The height of the thin-film device was 70 μm. The composition of the dielectric thin film in Sample 43 was the same as that in Sample 26. Tri the making of Sample 43, an Ni foil having a thickness of 50 μm was used as the base electrode. As each upper electrode, a Cu electrode having a thickness of 1 μm was formed. As the insulating resin layer, a polyimide layer was formed. The lead electrodes were formed from Cu.

The insulation resistance value of Sample 43 was measured before and after the high-temperature load test and high-temperature, high-humidity load test as with Sample 1. As a result, Sample 43 was seen to exhibit an insulation resistance value on a par with that of Sample 26 and have high reliability.

REFERENCE SIGNS LIST

1 ... thin-film capacitor; 2 ... base electrode; 2a ... Ni foil; 3 ... dielectric thin film; 3a ... columnar structure; 3b ... granular structure; 4 ... upper electrode; 5 ... insulating resin layer; 6 ... dead electrode; 10 ... epoxy-based resin substrate; 20 ... resin layer; 30 ... insulating coating layer; 50 ... metal lead; 40 ... electronic component; 100 ... electronic circuit board

What is claimed is:

1. A thin-film capacitor comprising a dielectric thin film and electrodes opposing each other through the dielectric thin film interposed therebetween; wherein the dielectric thin film contains:
a perovskite-type composite oxide having a composition expressed by the following chemical formula (1), Mn, and
at least one kind of element M selected from the group consisting of V, Nb, and Ta;
wherein the dielectric thin film has an Mn content of 0.05 to 0.45 mol with respect to 100 mol of the composite oxide; and
wherein the dielectric thin film has a total element M content of 0.05 to 0.5 mol with respect to 100 mol of the composite oxide:

$$A_yBO_3 \qquad (1)$$

where A is at least one kind of element selected from the group consisting of Ba, Sr, Ca, and Pb, B is at least one kind of element selected from the group consisting of Ti, Zr, Hf, and Sn, and $0.97 \leqq y \leqq 0.995$,
wherein at least a part of the dielectric thin film has a columnar structure, and the columnar structure has columnar crystals extending normal to an electrode surface.

2. A thin-film capacitor according to claim 1, wherein the dielectric thin film has a rare-earth element content of 0.0 to 0.3 mol with respect to 100 mol of the composite oxide.

3. An electronic circuit board comprising the thin-film capacitor according to claim 1.

* * * * *